(12) United States Patent
Mitsuhashi et al.

(10) Patent No.: US 11,884,546 B2
(45) Date of Patent: Jan. 30, 2024

(54) MULTILAYER BODY AND ELECTRONIC DEVICE

(71) Applicant: SUMITOMO ELECTRIC INDUSTRIES, LTD., Osaka (JP)

(72) Inventors: Fuminori Mitsuhashi, Osaka (JP);
Yasunori Tateno, Osaka (JP);
Masahiro Adachi, Osaka (JP);
Yoshiyuki Yamamoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 449 days.

(21) Appl. No.: 17/421,057

(22) PCT Filed: Sep. 20, 2019

(86) PCT No.: PCT/JP2019/037057
§ 371 (c)(1),
(2) Date: Jul. 7, 2021

(87) PCT Pub. No.: WO2020/158041
PCT Pub. Date: Aug. 6, 2020

(65) Prior Publication Data
US 2022/0064005 A1 Mar. 3, 2022

(30) Foreign Application Priority Data
Jan. 28, 2019 (JP) ................. 2019-012044

(51) Int. Cl.
*C01B 32/182* (2017.01)
*H01L 29/16* (2006.01)
*H01L 29/76* (2006.01)

(52) U.S. Cl.
CPC ........ *C01B 32/182* (2017.08); *H01L 29/1606* (2013.01); *H01L 29/7606* (2013.01); *C01B 2204/04* (2013.01); *C01B 2204/22* (2013.01)

(58) Field of Classification Search
None
See application file for complete search history.

(56) References Cited

U.S. PATENT DOCUMENTS

2017/0301758 A1* 10/2017 Okada ............... H01L 21/02433

FOREIGN PATENT DOCUMENTS

JP 2015-048258 A 3/2015

OTHER PUBLICATIONS

International Search Report for corresponding Application No. PCT/JP2019/037057, dated May 11, 2019.

(Continued)

*Primary Examiner* — William C Trapanese
(74) *Attorney, Agent, or Firm* — Renner, Otto, Boisselle & Sklar, LLP

(57) ABSTRACT

A multilayer body includes a base portion and a graphene film. In an ion mass distribution versus depth of the multilayer body determined by time-of-flight secondary ion mass spectrometry, detection intensities of $C_6$ ions have a maximum value at a depth of greater than 0 nm and 2.5 nm or less from an exposed surface. Detection intensities of $C_3$ ions have a maximum value at a depth of greater than 0 nm and 3.0 nm or less from the exposed surface. Detection intensities of $SiC_4$ ions have a maximum value at a depth of 0.5 nm or greater and 5.0 nm or less from the exposed surface. Detection intensities of SiC ions have a maximum value at a depth of 0.5 nm or greater and 10.0 nm or less from the exposed surface. Detection intensities of $Si_2$ ions have a maximum value at a depth of 0.5 nm or greater and 10.0 nm or less from the exposed surface. A value obtained by dividing the maximum value of the detection intensities of $SiC_4$ ions by an average of detection intensities of $SiC_4$ ions associated with a region of the multilayer body is 1 or greater and 3.5 or less, the region having distances from the (Continued)

exposed surface in a thickness direction of the multilayer body of equal to or greater than 8 nm and 12 nm or less.

20 Claims, 7 Drawing Sheets

(56) References Cited

OTHER PUBLICATIONS

"Special Issue: Surface Science of Nano-Carbon Materials" (Fukidome, Hirokazu. Nanoscale Control of Structural and Electronic Properties of Graphene through Substrate Interaction. Hyomen Kagaku.)vol. 33, No. 10, 2012, Aug. 2, 2012, pp. 546-551. (with English Abstract; English translation is not readily available, concise explanation of relevance provided in International Search Report for corresponding Application No. PCT/JP2019/037057).
(Tokumitsu, Eisuke. Current control of graphene channel transistors using semiconductor contacts. Grant-in-Aid for Scientific Research, Final Research Report: 1-5.) 1-5, JAIST, Jun. 6, 2014 (with English Abstract; English translation is not readily available, concise explanation of relevance provided in International Search Report for corresponding Application No. PCT/JP2019/037057).

\* cited by examiner

MULTILAYER BODY AND ELECTRONIC DEVICE

TECHNICAL FIELD

The present disclosure relates to a multilayer body and an electronic device.

The present application claims priority to Japanese Patent Application No. 2019-012044, filed on Jan. 28, 2019, the entire contents of which are incorporated herein by reference.

BACKGROUND ART

Graphene is a substance in which carbon atoms are two-dimensionally bonded to one another with the formation of $sp^2$ hybrid orbitals. With this bonding state of the carbon atoms, graphene has a very high carrier (electron) mobility. Effective utilization of graphene as a channel of an electronic device, such as a transistor, leads to improvement in the performance of the electronic device.

There is a proposed method for obtaining a multilayer body in which a graphene film is formed in a surface layer portion of a substrate; this is achieved by heating a substrate made of SiC (silicon carbide) to remove silicon atoms, thereby converting a surface layer portion of the substrate into graphene (see, for example, PTL 1). According to PTL 1, after silicon atoms are removed, a hydrogen treatment is performed on the substrate to bind hydrogen to the terminals of silicon atoms located on the substrate side.

CITATION LIST

Patent Literature

PTL 1: Japanese Unexamined Patent Application Publication No. 2015-48258

SUMMARY OF INVENTION

A multilayer body according to the present disclosure includes a base portion and a graphene film. The base portion includes silicon carbide and has a first major surface. The graphene film is disposed on the first major surface and has an exposed surface, the exposed surface being a major surface located on a side opposite to a side on which the base portion is located. In an ion mass distribution versus depth of the multilayer body determined by time-of-flight secondary ion mass spectrometry that uses bismuth ions as primary ions and uses cesium ions as sputtering ions, detection intensities of $C_6$ ions have a maximum value at a depth of greater than 0 nm and 2.5 nm or less from the exposed surface. Detection intensities of $C_3$ ions have a maximum value at a depth of greater than 0 nm and 3.0 nm or less from the exposed surface. Detection intensities of $SiC_4$ ions have a maximum value at a depth of 0.5 nm or greater and 5.0 nm or less from the exposed surface. Detection intensities of SiC ions have a maximum value at a depth of 0.5 nm or greater and 10.0 nm or less from the exposed surface. Detection intensities of $Si_2$ ions have a maximum value at a depth of 0.5 nm or greater and 10.0 nm or less from the exposed surface. A value obtained by dividing the maximum value of the detection intensities of $SiC_4$ ions by an average of detection intensities of $SiC_4$ ions associated with a region of the multilayer body is 1 or greater and 3.5 or less, the region having distances from the exposed surface in a thickness direction of the multilayer body of equal to or greater than 8 nm and 12 nm or less.

DESCRIPTION OF EMBODIMENTS

Figure 1:
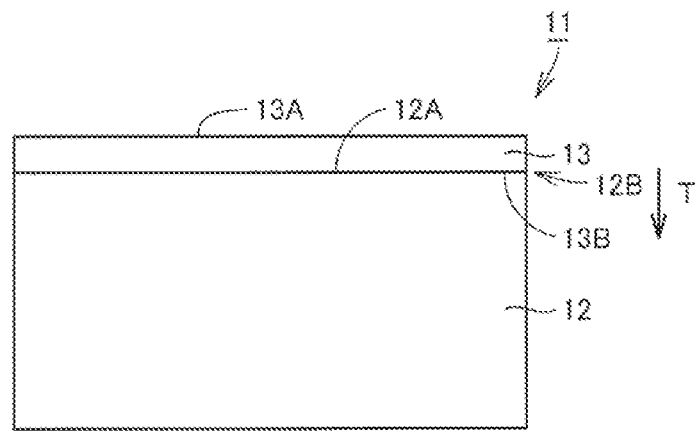
FIG. 1 is a schematic cross-sectional view of a structure of a multilayer body of a first embodiment.

Problem to be Solved by Present Disclosure

In instances in which an electronic device is manufactured with a multilayer body of the related art, a problem arises in that high modulation characteristics are not achieved. Accordingly, an object is to provide a multilayer body having improved modulation characteristics and an electronic device including the multilayer body.

Advantageous Effects of Present Disclosure

A multilayer body having improved modulation characteristics and an electronic device including the multilayer body are provided.

Description of Embodiment of Present Disclosure

First, aspects of an embodiment of the present disclosure will be enumerated and described. A multilayer body according to the present disclosure includes a base portion and a graphene film. The base portion includes silicon carbide and has a first major surface. The graphene film is disposed on the first major surface and has an exposed surface, the exposed surface being a major surface located on the side opposite to the side on which the base portion is located. In an ion mass distribution versus depth of the multilayer body determined by time-of-flight secondary ion mass spectrometry that uses bismuth ions as primary ions and uses cesium ions as sputtering ions, detection intensities of $C_6$ ions have a maximum value at a depth of greater than 0 nm and 2.5 nm or less from the exposed surface. Detection intensities of $C_3$ ions have a maximum value at a depth of greater than 0 nm and 3.0 nm or less from the exposed surface. Detection intensities of $SiC_4$ ions have a maximum value at a depth of 0.5 nm or greater and 5.0 nm or less from the exposed surface. Detection intensities of SiC ions have a maximum value at a depth of 0.5 nm or greater and 10.0 nm or less from the exposed surface. Detection intensities of $Si_2$ ions have a maximum value at a depth of 0.5 nm or greater and 10.0 nm or less from the exposed surface. The value obtained by dividing the maximum value of the detection intensities of $SiC_4$ ions by an average of detection intensities of $SiC_4$ ions associated with a region of the multilayer body is 1 or greater and 3.5 or less, the region having distances from the exposed surface in a thickness direction of the multilayer body of equal to or greater than 8 nm and 12 nm or less.

In multilayer bodies including a base portion that includes silicon carbide and including a graphene film disposed on the base portion, the graphene film has a very high carrier (electron) mobility. It is, therefore, conceivable to utilize the graphene film in a channel layer of a transistor, which is an electronic device.

The present inventors performed studies regarding means for improving modulation characteristics associated with instances in which a transistor that uses a graphene film as a channel layer is manufactured. As a result, the following finding was made. When the position of the maximum value of the intensities, which are detected by time-of-flight secondary ion mass spectrometry (TOF-SIMS), of each of the ions and the intensity ratio of $SiC_4$ ions are as described above, the modulation characteristics are improved.

A reason that the modulation characteristics are improved when the detection state of each of the ions is as described above is believed to be as follows, for example. Multilayer bodies including a base portion made of SiC and including a graphene film have a configuration in which the graphene film, the interface between the graphene film and the base portion, and the base portion are disposed in this order starting from the exposed surface side. When there is an influence of, for example, a decrease in the crystallinity of the interface between the graphene film and the base portion, it is likely that a resistance layer that interferes with the operation of a transistor is formed. If such a resistance layer exists, a magnitude of a drain current with respect to an applied drain voltage does not change with a varying gate voltage, that is, high modulation characteristics are not achieved. In addition, in a case where a transistor is manufactured with such a multilayer body, since the transconductance is reduced, the transistor may have degraded high-frequency characteristics despite the fact that the transistor includes a graphene film, which has a high carrier mobility.

It should be noted that regarding the time-of-flight secondary ion mass spectrometry described above, the CA ions are molecular ions consisting of six C atoms and are believed to be detected primarily because of the presence of graphene. The $C_3$ ions are molecular ions consisting of three C atoms and are believed to be detected primarily because of the presence of graphene. The $SiC_4$ ions are molecular ions consisting of one Si atom and four C atoms and are believed to be detected primarily in association with the interface between the graphene film and the base portion. The SiC ions are molecular ions consisting of one Si atom and one C atom and are believed to be detected primarily in association with the base portion. The $Si_2$ ions are molecular ions consisting of two Si atoms and are believed to be detected primarily in association with the base portion.

In cases where a state is achieved in which the $C_6$ ions and the $C_3$ ions, which correspond to graphene, have peaks at positions very close to the exposed surface to such an extent that the above-mentioned conditions are satisfied, the graphene film has sufficient crystallinity in a region near the exposed surface. Furthermore, in cases where a state is achieved in which the SiC ions and $Si_2$ ions, which correspond to SiC, have peaks at positions distant from the exposed surface to such an extent that the above-mentioned conditions are satisfied, the SiC has sufficient crystallinity at a location sufficiently distant from the exposed surface. A state is to be achieved in which the $SiC_4$ ions, which correspond to the transition region of Si and C at the interface between the graphene film and the base portion, have a peak at a position somewhat distant from the exposed surface to such an extent that the above-described condition is satisfied. In addition, the value obtained by dividing the maximum value of the detection intensities of $SiC_4$ ions by an average intensities of $SiC_4$ ions located in a region in which the SiC is disposed is to be within the above-mentioned range. In cases where these are achieved, the crystallinity of the interface between the graphene film and the base portion is appropriate, and an amount of the molecules consisting of Si and C that are present at the interface is appropriate, with no excess molecules. It can be presumed that the multilayer body having the configuration described above provides improved modulation characteristics.

In the multilayer body, the detection intensities of $C_6$ ions may have a maximum value at a depth of greater than 0 nm and 1.5 nm or less from the exposed surface. In this case, in the multilayer body, the graphene film is located closer to the exposed surface side, and, therefore, the modulation characteristics are further improved. Note that the detection intensities of $C_6$ ions may have a maximum value at a depth of greater than 0 nm and 1.0 nm or less from the exposed surface; with this configuration, the modulation characteristics are further improved.

In the multilayer body, the detection intensities of $C_3$ ions may have a maximum value at a depth of greater than 0 nm and 2.0 nm or less from the exposed surface. In this case, in the multilayer body, the graphene film is located closer to the exposed surface side, and, therefore, the modulation characteristics are further improved. Note that the detection intensities of $C_3$ ions may have a maximum value at a depth of greater than 0 nm and 1.0 nm or less from the exposed surface; with this configuration, the modulation characteristics are further improved.

In the multilayer body, the detection intensities of $SiC_4$ ions may have a maximum value at a depth of 0.5 nm or greater and 3.5 nm or less from the exposed surface. In this case, in the multilayer body, the interface between the graphene film and the base portion is located closer to the exposed surface side, and, therefore, the modulation characteristics are further improved. Note that the detection intensities of $SiC_4$ ions may have a maximum value at a depth of 0.5 nm or greater and 3.5 nm or less from the exposed surface; with this configuration, the modulation characteristics are further improved.

In the multilayer body, the value obtained by dividing the maximum value of the detection intensities of $SiC_4$ ions by an average of detection intensities of $SiC_4$ ions associated with a region of the multilayer body may be 1 or greater and 2.5 or less, the region having distances from the exposed surface in a thickness direction of the multilayer body of equal to or greater than 8 nm and 12 nm or less. In this case, in the multilayer body, the crystallinity of the interface between the graphene film and the base portion is more appropriate, an amount of the molecules consisting of Si and C that are present at the interface is more appropriate, and, therefore, the modulation characteristics are further improved.

In the multilayer body, the detection intensities of SiC ions may have a maximum value at a depth of 0.5 nm or greater and 8.0 nm or less from the exposed surface. The detection intensities of $Si_2$ ions may have a maximum value at a depth of 0.5 nm or greater and 8.0 nm or less from the exposed surface. In these cases, in the multilayer body, the base portion made of SiC is located suitably distant from the exposed surface, and, therefore, the modulation characteristics are further improved. Note that the detection intensities of SiC ions may have a maximum value at a depth of 0.5 nm or greater and 1.5 nm or less from the exposed surface. Furthermore, the detection intensities of $Si_2$ ions may have a maximum value at a depth of 0.5 nm or greater and 1.5 nm or less from the exposed surface. In these cases, the modulation characteristics are further improved.

In the multilayer body, the number of atomic layers of the graphene film may be 1 or greater and 5 or less. In such a case, the multilayer body includes a graphene film that consistently ensures a high carrier mobility.

In the multilayer body, the first major surface may be the carbon plane of the silicon carbide. In this case, the forming of the graphene film, which is accomplished by removing silicon atoms from the surface of the substrate, can be efficiently achieved.

An electronic device according to the present disclosure includes the multilayer body, a first electrode, and a second electrode. The first electrode is disposed on the exposed surface. The second electrode is disposed on the exposed surface and spaced apart from the first electrode.

Since the electronic device includes the multilayer body, the electronic device has improved modulation characteristics.

Details of Embodiment of Present Disclosure

Now, an embodiment of the multilayer body of the present disclosure will be described with reference to the drawings. Throughout the attached drawings, the same or similar parts are assigned the same reference character, and a description thereof will not be repeated.

First Embodiment

Figure 2:
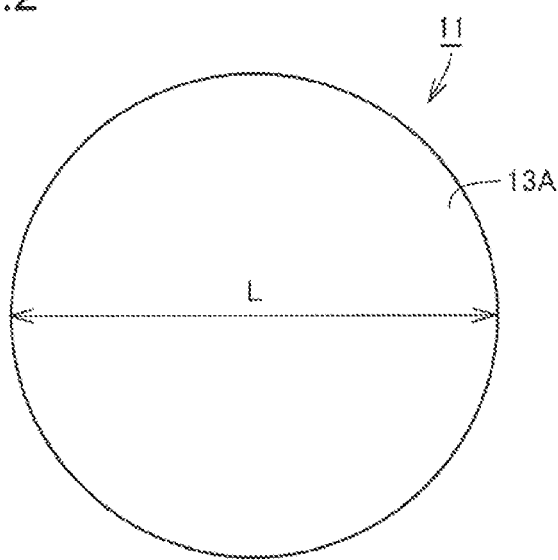
FIG. 2 is a view of the multilayer body of the first embodiment as viewed in a thickness direction thereof.

A multilayer body according to a first embodiment of the present disclosure will be described. FIG. 1 is a schematic cross-sectional view of a structure of the multilayer body according to the first embodiment. FIG. 2 is a view of the multilayer body of the first embodiment as viewed in a thickness direction thereof. In FIG. 1, an arrow T indicates a depth direction of a multilayer body 11.

Referring to FIG. 1 and FIG. 2, the multilayer body 11 of the first embodiment has a disc shape. The multilayer body 11 illustrated in FIG. 2 has a diameter L, which is, for example, 2 inches (50.8 mm).

The multilayer body 11 of the first embodiment includes a base portion 12 and a graphene film 13. The base portion 12 has a plate shape. The base portion 12 includes silicon carbide. The base portion 12 is made of silicon carbide (SiC). A material that forms the base portion 12 is silicon carbide. The SiC that forms the base portion 12 is hexagonal SiC, which has, for example, a 6H structure. The base portion 12 has a first major surface 12A. The first major surface 12A has a planar shape. The first major surface 12A is the carbon plane of the SiC that forms the base portion 12.

The graphene film 13 is disposed on the first major surface 12A of the base portion 12. The graphene film 13 is disposed such that one major surface 13B thereof faces the first major surface 12A of the base portion 12. Another major surface of the graphene film 13, which is located on the side opposite to the one major surface 13B with respect to a thickness direction of the graphene film 13, constitutes an exposed surface 13A of the multilayer body 11. That is, the graphene film 13 has the exposed surface 13A, which is a major surface located on the side opposite to the side on which the base portion 12 is located. In the present embodiment, the number of atomic layers of the graphene film 13 may be 1 or greater and 5 or less. Note that the number of atomic layers of the graphene film 13 can be determined by conducting a TEM (Transmission Electron Microscope) examination of a cross section of the multilayer body 11 taken along a plate thickness direction thereof. The thickness direction of the graphene film 13 is indicated by the arrow T. Note that, in FIG. 1, the thickness of the graphene film 13 is depicted as being large for ease of understanding.

The multilayer body 11 is a structure including the graphene film 13, an interface 12B between the graphene film 13 and the base portion 12, and the base portion 12, which are disposed in this order in the depth direction starting from the exposed surface 13A side.

Figure 3:
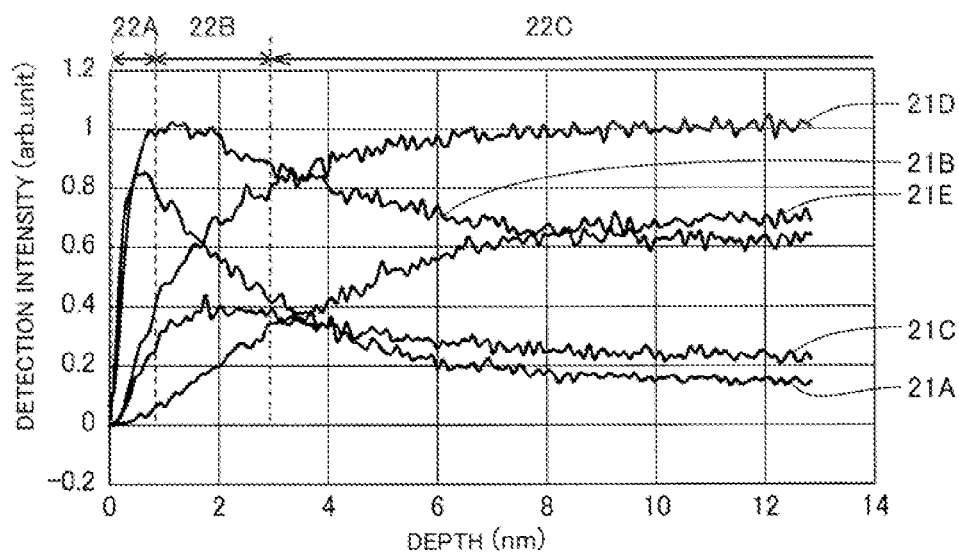
FIG. 3 is a graph illustrating the results of time-of-flight secondary ion mass spectrometry of the multilayer body of the first embodiment.

FIG. 3 is a graph illustrating the results of time-of-flight secondary ion mass spectrometry (TOF-SIMS: Time-of-Flight Secondary Ion Mass Spectrometry) of the multilayer body 11 of the first embodiment. In FIG. 3, the vertical axis represents a detection intensity (arb. unit), and the horizontal axis represents a depth (nm) from the exposed surface 13A in a thickness direction of the multilayer body 11. The vertical axis represents normalized values obtained by using an average of the detection intensities of SiC ions associated with a region of the multilayer body 11, the average being taken as 1, and the region having distances from the exposed surface 13A in the thickness direction of the multilayer body 11 of equal to or greater than 10 nm and 12 nm or less. In FIG. 3, a line 21A represents the detection intensities of $C_6$ ions, a line 21B represents the detection intensities of $C_3$ ions, a line 21C represents the detection intensities of $SiC_4$ ions, a line 21D represents the detection intensities of SiC ions, and a line 21E represents the detection intensities of $Si_2$ ions. Furthermore, in FIG. 3, a region 22A primarily represents a region in which the graphene film 13 is present, a region 22B primarily represents a region of the interface 12B between the graphene film 13 and the base portion 12, and a region 22C primarily represents a region in which the base portion 12 is present.

For the time-of-flight secondary ion mass spectrometry (TOF-SIMS), a TOF.SIMS 5, manufactured by ION-TOF is employed, for example, as the instrument. A time-of-flight secondary ion mass spectrometer was used as the mass spectrometer, bismuth ions were used as the primary ions, and cesium ions were used as the sputtering ions. Regarding the sputtering rate, a depth direction of $SiO_2$ used as a standard was the index, the depth resolution was 0.01 to 0.15 nm/point, and the measurement depth was 10 nm or greater based on the standard. Regarding the measurement area, an average profile of areas of 25 to 2500 μm² was obtained for measurement points over a depth from the exposed surface 13A to the position at which the maximum value of the detection intensities of $C_6$ ions is detected, that is, over a depth of greater than 0 nm and 2.5 nm or less in the thickness direction of the multilayer body 11.

Referring to FIG. 3, regarding the multilayer body 11 of the first embodiment, in an ion mass distribution versus depth of the multilayer body 11 determined by time-of-flight secondary ion mass spectrometry, the detection intensities of CG ions have a maximum value at a depth of greater than 0 nm and 2.5 nm or less from the exposed surface 13A. The detection intensities of $C_3$ ions have a maximum value at a depth of greater than 0 nm and 3.0 nm or less from the exposed surface 13A. The detection intensities of $SiC_4$ ions have a maximum value at a depth of 0.5 nm or greater and 5.0 nm or less from the exposed surface 13A. The detection intensities of SiC ions have a maximum value at a depth of 0.5 nm or greater and 10.0 nm or less from the exposed surface 13A. The detection intensities of $Si_2$ ions have a maximum value at a depth of 0.5 nm or greater and 10.0 nm or less from the exposed surface 13A. The value obtained by dividing the maximum value of the detection intensities of $SiC_4$ ions by an average of detection intensities of $SiC_4$ ions associated with a region of the multilayer body 11 is 1 or greater and 3.5 or less, the region having distances from the exposed surface 13A in a thickness direction of the multilayer body 11 of equal to or greater than 8 nm and 12 nm or less.

Specifically, in the multilayer body 11 of the first embodiment, a distance in the thickness direction of the multilayer body 11 from the exposed surface 13A to the position at which the maximum value of the detection intensities of C ions is detected is approximately 0.4 nm. In the multilayer body 11 of the first embodiment, a distance in the thickness direction of the multilayer body 11 from the exposed surface 13A to the position at which the maximum value of the detection intensities of $C_3$ ions is detected is approximately 1.1 nm. In the multilayer body 11 of the first embodiment, a distance in the thickness direction of the multilayer body 11 from the exposed surface 13A to the position at which the maximum value of the detection intensities of $SiC_4$ ions is detected is approximately 1.7 nm. In the multilayer body 11 of the first embodiment, a distance in the thickness direction of the multilayer body 11 from the exposed surface 13A to the position at which the maximum value of the detection intensities of SiC ions is detected is approximately 8 nm. In the multilayer body 11 of the first embodiment, a distance in the thickness direction of the multilayer body 11 from the exposed surface 13A to the position at which the maximum value of the detection intensities of $Si_2$ ions is detected is approximately 8 nm. The value obtained by dividing the maximum value of the detection intensities of $SiC_4$ ions by an average of detection intensities of $SiC_4$ ions associated with a region of the multilayer body 11 is approximately 1.8, the region having distances from the exposed surface 13A in the thickness direction of the multilayer body 11 of equal to or greater than 8 nm and 12 nm or less.

Figure 4:
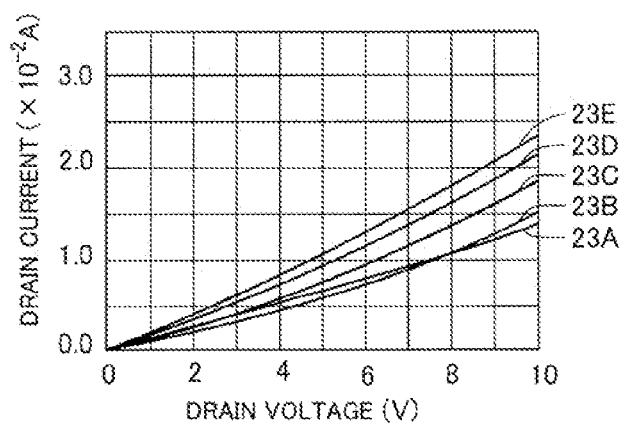
FIG. 4 is a graph illustrating a relationship between a drain voltage and a drain current under a varying gate voltage, in a transistor manufactured with the multilayer body of the first embodiment.

FIG. 4 is a graph illustrating a relationship between a drain voltage and a drain current under a varying gate voltage, in a transistor manufactured with the multilayer body 11 of the first embodiment. In FIG. 4, the vertical axis represents a drain current (A), and the horizontal axis represents a drain voltage (V). Furthermore, in FIG. 4, a line 23A represents an instance in which the gate voltage is 10V, a line 23B represents an instance in which the gate voltage is 5V, a line 23C represents an instance in which the gate voltage is 0V, a line 23D represents an instance in which the gate voltage is −5V, and a line 23E represents an instance in which the gate voltage is −10V.

Referring to FIG. 4, for the instances in which the gate voltage was varied from −10 V to 10 V with an increment of 5 V, the drain currents that flowed in accordance with the magnitude of the applied drain voltage varied. This indicates improved modulation characteristics.

Figure 5:
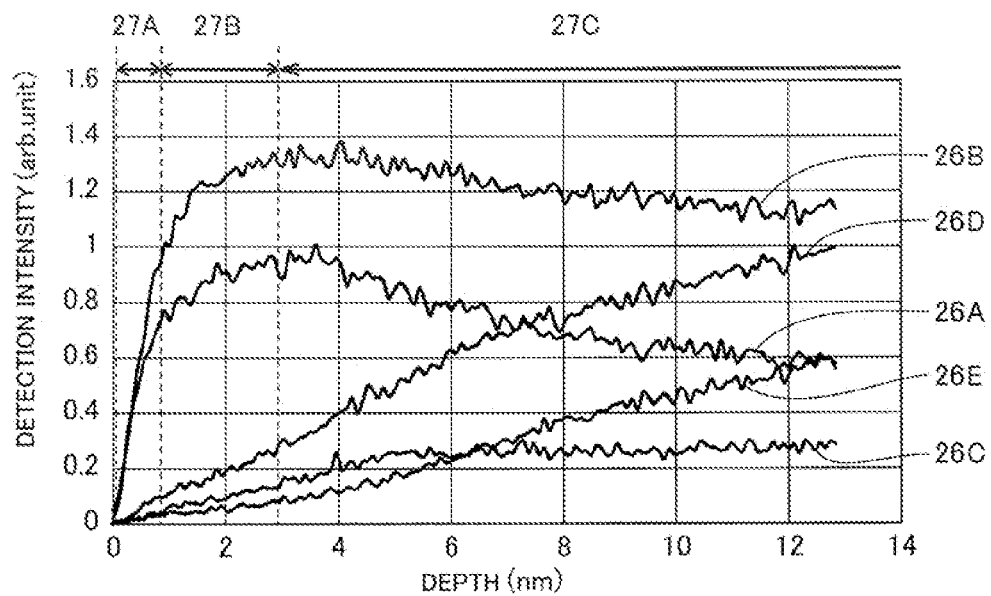
FIG. 5 is a graph illustrating the results of time-of-flight secondary ion mass spectrometry of a multilayer body that is outside the scope of the present disclosure.

FIG. 5 is a graph illustrating the results of time-of-flight secondary ion mass spectrometry of a multilayer body that is outside the scope of the present disclosure. The vertical axis and the horizontal axis have the same meaning as in the instance illustrated in FIG. 3. In FIG. 5, a line 26A represents the detection intensities of $C_6$ ions, a line 26B represents the detection intensities of $C_3$ ions, a line 26C represents the detection intensities of $SiC_4$ ions, a line 26D represents the detection intensities of SiC ions, and a line 26E represents the detection intensities of $Si_2$ ions. Furthermore, in FIG. 5, a region 27A primarily represents a region in which a graphene film is present, a region 27B primarily represents a region of the interface between the graphene film and a base portion, and a region 27C primarily represents a region in which the base portion is present.

In the instance of the multilayer body illustrated in FIG. 5, in the time-of-flight secondary ion mass spectrometry, a distance in a thickness direction of the multilayer body from an exposed surface to the position at which the maximum value of the intensities of $C_6$ ions is detected is approximately 3.5 nm, which is longer than 2.5 nm. A distance in the thickness direction of the multilayer body from the exposed surface to the position at which the maximum value of the intensities of $C_3$ ions is detected is approximately 4 nm, which is longer than 3.0 nm. The intensity of $SiC_4$ ions with respect to the exposed surface, the intensity of SiC ions with respect to the exposed surface, and the intensity of $Si_2$ ions with respect to the exposed surface continued to increase gradually, and in each of the instances, a distance from the exposed surface to the position at which the maximum value of the intensities is detected is longer than 12 nm.

Figure 6:
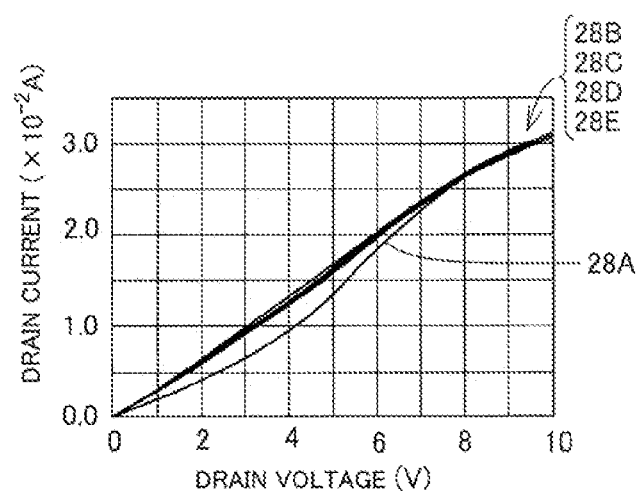
FIG. 6 is a graph illustrating a relationship between a drain voltage and a drain current under a varying gate voltage, in a transistor manufactured with a multilayer body having the feature associated with time-of-flight secondary ion mass spectrometry illustrated in FIG. 5.

FIG. 6 is a graph illustrating a relationship between a drain voltage and a drain current under a varying gate voltage, in a transistor manufactured with a multilayer body having the feature associated with time-of-flight secondary ion mass spectrometry illustrated in FIG. 5. In FIG. 6, the vertical axis and the horizontal axis have the same meaning as in the instance illustrated in FIG. 4. Furthermore, in FIG. 6, a line 28A represents an instance in which the gate voltage is 10V, a line 28B represents an instance in which the gate voltage is 5V, a line 28C represents an instance in which the gate voltage is 0V, a line 28D represents an instance in which the gate voltage is −5V, and a line 28E represents an instance in which the gate voltage is −10V.

Referring to FIG. 6, the line 28B, the line 28C, the line 28D, and the line 28E substantially overlap one another. Tat is, for the instances in which the gate voltage was varied from −10 V to 5 V with an increment of 5 V, the drain currents that flowed in accordance with the magnitude of the applied drain voltage were substantially similar. Electronic devices including such a multilayer body cannot provide high modulation characteristics.

Note that in the multilayer body 11, the detection intensities of $C_6$ ions have a maximum value at a depth of greater than 0 nm and 1.5 nm or less from the exposed surface. In this case, in the multilayer body 11, the graphene film 13 is located closer to the exposed surface 13A side, and, therefore, the modulation characteristics are further improved. Note that the detection intensities of $C_6$ ions may have a maximum value at a depth of greater than 0 nm and 1.0 nm or less from the exposed surface 13A; with this configuration, the modulation characteristics are further improved.

Furthermore, in the multilayer body 11, the detection intensities of $C_3$ ions have a maximum value at a depth of greater than 0 nm and 2.0 nm or less from the exposed surface 13A. In this case, in the multilayer body 11, the graphene film 13 is located closer to the exposed surface 13A side, and, therefore, the modulation characteristics are further improved. Note that the detection intensities of $C_3$ ions may have a maximum value at a depth of greater than 0 nm and 1.0 nm or less from the exposed surface 13A; with this configuration, the modulation characteristics are further improved.

Furthermore, in the multilayer body 11, the detection intensities of $SiC_4$ ions have a maximum value at a depth of 0.5 nm or greater and 3.5 nm or less from the exposed surface 13A. In this case, in the multilayer body 11, the interface 12B between the graphene film 13 and the base portion 12 is located closer to the exposed surface 13A side, and, therefore, the modulation characteristics are further improved. Note that the detection intensities of $SiC_4$ ions may have a maximum value at a depth of 0.5 nm or greater and 3.5 nm or less from the exposed surface 13A; with this configuration, the modulation characteristics are further improved.

Furthermore, in the multilayer body 11, the value obtained by dividing the maximum value of the detection intensities of $SiC_4$ ions by an average of detection intensities of $SiC_4$ ions associated with a region of the multilayer body 11 is 1 or greater and 2.5 or less, the region having distances from the exposed surface 13A in a thickness direction of the multilayer body 11 of equal to or greater than 8 nm and 12 nm or less. In this case, in the multilayer body 11, the crystallinity of the interface 12B between the graphene film 13 and the base portion 12 is more appropriate, an amount of the molecules consisting of Si and C that are present at the interface 12B is more appropriate, and, therefore, the modulation characteristics are further improved.

Furthermore, in the multilayer body 11, the detection intensities of SiC ions have a maximum value at a depth of 0.5 nm or greater and 8.0 nm or less from the exposed surface 13A. The detection intensities of $Si_2$ ions have a maximum value at a depth of 0.5 nm or greater and 8.0 nm or less from the exposed surface 13A. In these cases, in the multilayer body 11, the base portion 12 made of SiC is located suitably distant from the exposed surface 13A, and, therefore, the modulation characteristics are further improved. Note that the detection intensities of SiC ions may have a maximum value at a depth of 0.5 nm or greater and 1.5 nm or less from the exposed surface 13A. Furthermore, the detection intensities of $Si_2$ ions may have a maximum value at a depth of 0.5 nm or greater and 1.5 nm or less from the exposed surface 13A. In these cases, the modulation characteristics are further improved.

Note that in the embodiment described above, the number of atomic layers of the graphene film 13 is 1 or greater and 5 or less, but, if necessary, it is possible to employ a graphene film 13 in which the number of atomic layers is 6 or greater.

Figure 8:
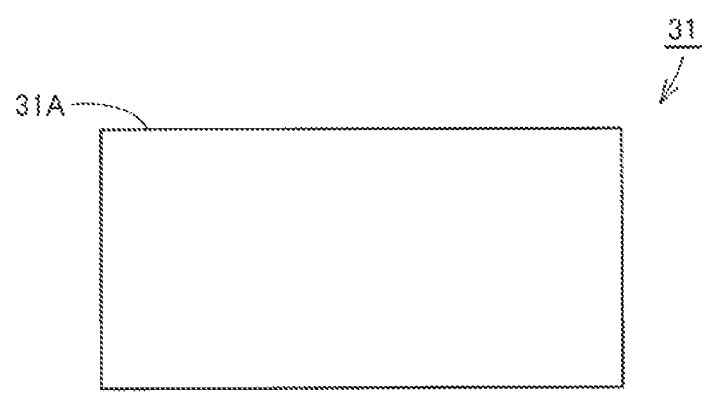
FIG. 8 is a schematic cross-sectional view for illustrating a method for manufacturing the multilayer body of the first embodiment.
Figure 9:
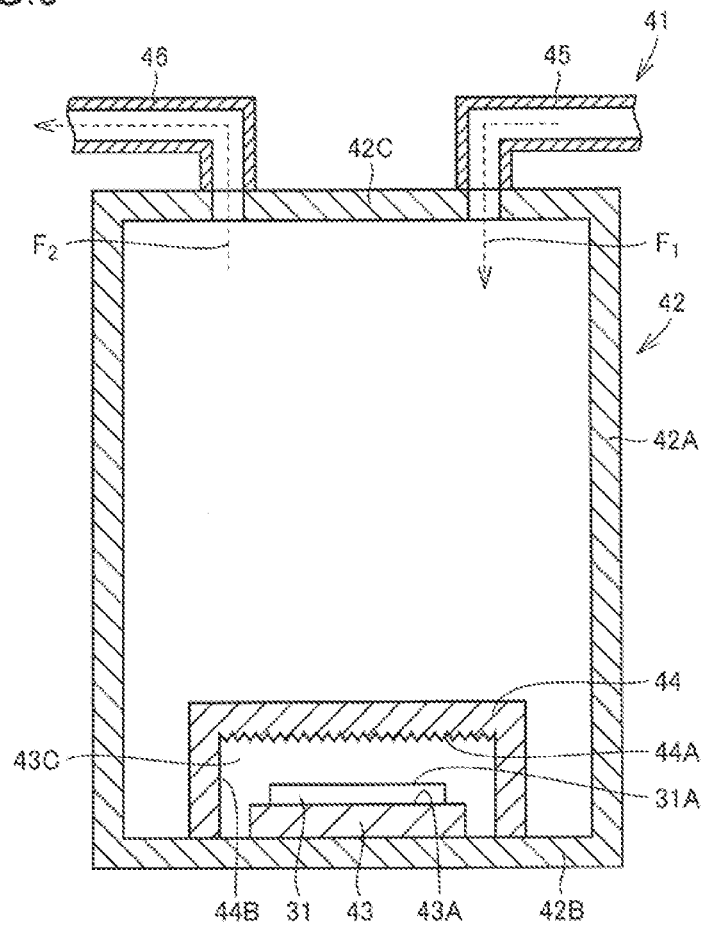
FIG. 9 is a schematic cross-sectional view illustrating a structure of a heating apparatus.

Now, referring to FIG. 7 to FIG. 9, an overview of an exemplary method for manufacturing the multilayer body 11 of the first embodiment will be described.

Figure 7:
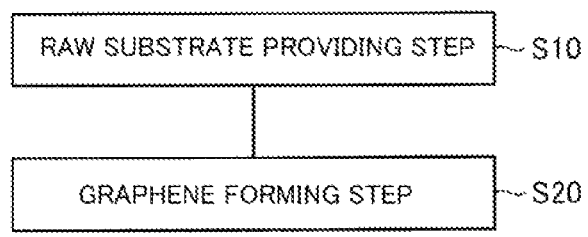
FIG. 7 is a flowchart illustrating representative steps of a method for manufacturing the multilayer body of the first embodiment.

FIG. 7 is a flowchart illustrating representative steps of a method for manufacturing the multilayer body 11 of the first embodiment. Referring to FIG. 7, in the method for manufacturing the multilayer body 11 of the first embodiment, a step (S10), which is a raw substrate providing step, is first carried out. FIG. 8 is a schematic cross-sectional view for illustrating the method for manufacturing the multilayer body 11. Referring to FIG. 8, in this step (S10), a raw substrate 31, which is, for example, made of 6H-SiC and has a diameter of 2 inches (50.8 mm), is provided. Specifically, the raw substrate 31 made of SiC can be obtained, for example, by slicing an ingot made of SiC. After a surface of the raw substrate 31 is polished, processes such as cleaning are performed, and as a result, flatness and cleanliness of the major surface are ensured. The raw substrate 31 has a first major surface 31A. The first major surface 31A is the carbon plane of the SiC that forms the raw substrate 31.

Next, a step (S20), which is a graphene forming step, is carried out. This step (S20) can be carried out, for example, by using a heating apparatus illustrated in FIG. 9. FIG. 9 is a schematic cross-sectional view illustrating a structure of the heating apparatus. Referring to FIG. 9, a heating apparatus 41 includes a body portion 42, a susceptor 43, a cover member 44, a gas inlet tube 45, and a gas outlet tube 46.

The body portion 42 includes a side wall portion 42A, a bottom wall portion 42B, and an upper wall portion 42C. The side wall portion 42A has a hollow cylindrical shape. The bottom wall portion 42B closes a first end of the side wall portion 42A. The upper wall portion 42C closes a second end of the side wall portion 42A. The susceptor 43 is disposed on the bottom wall portion 42B in the interior of the body portion 42. The susceptor 43 has a substrate holding surface 43A, on which the raw substrate 31 is to be held.

The cover member 44, which covers the susceptor 43, is disposed in the interior of the body portion 42. For example, the cover member 44 has a hollow cylindrical shape with one end of a pair of ends thereof being closed and the other end being open. The cover member 44 is disposed such that the other end side of the cover member 44 is in contact with the bottom wall portion 42B. The susceptor 43 and the raw substrate 31 on the susceptor 43 are surrounded by the cover member 44 and the bottom wall portion 42B of the body portion 42. The susceptor 43 and the raw substrate 31 on the susceptor 43 are disposed in a closed space 43C, which is a space surrounded by the cover member 44 and the bottom wall portion 42B of the body portion 42. The first major surface 31A of the raw substrate 31 faces an upper wall surface 44A of the cover member 44.

It should be noted that a technique for obtaining the multilayer body 11 of the first embodiment described above is as follows, for example: the upper wall surface 44A of the cover member 44, which faces the first major surface 31A, is designed to have a higher roughness than other portions of the cover member 44. Specifically, a surface roughness of the upper wall surface 44A is designed to be approximately twice the surface roughness of a side wall surface 44B of the cover member 44, though this depends on the heating temperature, the treatment time, and the like, which will be described later. In this case, a rate of sublimation for removing silicon atoms from the first major surface 31A is increased, and, therefore, the multilayer body 11 of the first embodiment can be easily obtained.

The gas inlet tube 45 and the gas outlet tube 46 are connected to the upper wall portion 42C of the body portion 42. One end of the gas inlet tube 45 and one end of the gas outlet tube 46 are connected to respective through-holes formed in the upper wall portion 42C. The other end of the gas inlet tube 45 is connected to a gas holding portion (not illustrated) that holds an inert gas. In the first embodiment, argon is held in the gas holding portion. The other end of the gas outlet tube 46 is connected to an exhaust device (not illustrated), such as a pump.

The step (S20) can be carried out in the following manner by using the heating apparatus 41. First, the raw substrate 31, which is provided in the step (S10), is placed on the substrate holding surface 43A of the susceptor 43. Next, the cover member 44 is placed on the bottom wall portion 42B to cover the susceptor 43 and the raw substrate 31. Accordingly, the susceptor 43 and the raw substrate 31 on the susceptor 43 are surrounded by the cover member 44 and the bottom wall portion 42B of the body portion 42.

Next, in a state in which a valve (not illustrated) attached to the gas inlet tube 45 is closed, a valve (not illustrated) attached to the gas outlet tube 46 is brought to a state of being open. Subsequently, upon actuation of the exhaust device connected to the gas outlet tube 46, the gas in the interior of the body portion 42 is discharged through the gas outlet tube 46 along an arrow $F_2$. Accordingly, the interior of the body portion 42 is depressurized. It should be noted that while the susceptor 43 and the raw substrate 31 are surrounded by the cover member 44 and the bottom wall portion 42B of the body portion 42, the cover member 44 and the bottom wall portion 42B are not joined to each other Consequently, as the depressurization in the interior of the body portion 42 progresses, the pressure difference between the interior of the closed space 43C and the exterior thereof causes the gas within the closed space 43C to be discharged through a minute opening between the cover member 44 and the bottom wall portion 42B. As a result, the interior of the closed space 43C is also depressurized.

Next, the operation of the exhaust device is stopped, and the valve attached to the gas inlet tube 45 is brought to a state of being open. This causes the argon held in the gas holding portion to flow through the gas inlet tube 45 to be introduced into the interior of the body portion 42 along an arrow $F_1$. It should be noted that as the pressure within the body portion 42 increases, the pressure difference between the interior of the closed space 43C and the exterior thereof causes the argon to flow into the interior through a minute opening between the cover member 44 and the bottom wall portion 42B. In this manner, the gas in the interior of the body portion 42 is replaced by the argon. When the pressure of the argon in the interior of the body portion 42 increases to a normal pressure (atmospheric pressure), excess argon is discharged through the gas outlet tube 46, and, accordingly, the pressure in the interior is maintained to be a normal pressure. That is, an argon atmosphere at normal pressure is maintained in the interior of the body portion 42.

Next, the raw substrate 31 is heated. For example, the raw substrate 31 is heated by heating the body portion 42. For example, the body portion 42 may be heated by induction heating. For example, the raw substrate 31 is heated to a temperature of 1300° C. or higher and 1800° C. or lower in argon at normal pressure. Specific details of the heat treatment may include heating at 1700° C. for 10 minutes, for example. In this case, referring to FIG. 8, silicon atoms are removed from the first major surface 31A side of the raw substrate 31 made of SiC, and, accordingly, a surface layer portion including the first major surface 31A is converted into graphene. It should be noted that as a result of the heating, the atomic arrangement of the region including the first major surface 31A is oriented with respect to the atomic arrangement of the SiC that forms the raw substrate 31. Consequently, the atomic arrangement of the graphene, which is formed as a result of the conversion of the first major surface 31A, is oriented with respect to the atomic arrangement of the SiC that forms the raw substrate 31. In this manner, referring to FIG. 1, the multilayer body 11 is obtained which includes the base portion 12 made of SiC and includes the graphene film 13 disposed on the first major surface 12A of the base portion 12, the graphene film 13 having an atomic arrangement that is oriented with respect to the atomic arrangement of the SiC that forms the base portion 12.

Note that the multilayer body 11 obtained as described above has good adhesion between the graphene film 13 and the base portion 12 made of SiC. Furthermore, the graphene film 13 is formed over the entire surface of the raw substrate 31. Accordingly, the multilayer body 11 is suitable for the manufacturing of an electronic device of which a mass production characteristic is required, such as a transistor.

Second Embodiment

Figure 10:
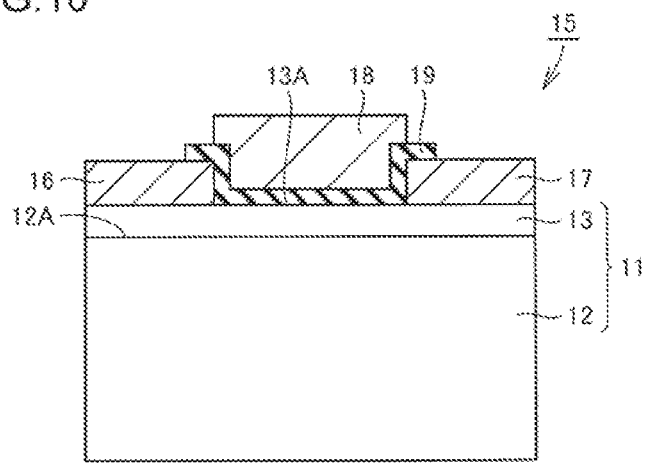
FIG. 10 is a schematic cross-sectional view of a field effect transistor (FET) of a second embodiment.

Now, an FET (Field Effect Transistor) will be described. The FET is an exemplary electronic device that is fabricated with the multilayer body 11 of the first embodiment. FIG. 10 is a schematic cross-sectional view of the FET of a second embodiment. Referring to FIG. 10, an FET 15 of the second embodiment is one fabricated with the multilayer body 11 of the first embodiment. The FET 15 includes the multilayer body 11 that includes the base portion 12 and the graphene film 13, which are layered as in the first embodiment. In addition, the FET 15 includes a source electrode 16, a drain electrode 17, a gate electrode 18, and a gate insulating film 19. The source electrode 16 is a first electrode. The drain electrode 17 is a second electrode spaced apart from the source electrode 16. The gate electrode 18 is a third electrode spaced apart from the source electrode 16 and the drain electrode 17.

The source electrode 16 is formed to be in contact with the exposed surface 13A. The source electrode 16 is made of a conductor capable of establishing ohmic contact with the graphene film 13. The conductor is, for example, Ni (nickel)/Au (gold). The drain electrode 17 is formed to be in contact with the exposed surface 13A. The drain electrode 17 is made of a conductor capable of establishing ohmic contact with the graphene film 13. The conductor is, for example, Ni/Au.

The gate electrode 18 is formed to cover the portion of the exposed surface 13A of the graphene film 13 located between the source electrode 16 and the drain electrode 17. The gate insulating film 19 covers the portion of the exposed surface 13A located between the source electrode 16 and the drain electrode 17, and the gate insulating film 19 extends to regions that cover portions of upper surfaces (major surfaces on the side opposite to the side that is in contact with the graphene film 13) of the source electrode 16 and the drain electrode 17. For example, the gate insulating film 19 is made of an insulator, such as silicon nitride (SiN) or aluminum oxide ($Al_2O_3$).

The gate electrode 18 is disposed on and in contact with the gate insulating film 19. The gate electrode 18 is disposed in a region corresponding to the portion of the exposed surface 13A located between the source electrode 16 and the drain electrode 17. The gate electrode 18 is made of a conductor, which is, for example, Ni/Au.

In the FET 15, when a voltage applied to the gate electrode 18 is less than a threshold voltage, that is, when the FET 15 is in an OFF state, sufficient electrons that serve as carriers are not present in the portion of the graphene film 13 located between the source electrode 16 and the drain electrode 17 (in the channel region), and, therefore, even when a voltage is applied between the source electrode 16 and the drain electrode 17, the non-conducting state is maintained. On the other hand, when a voltage greater than or equal to a threshold voltage is applied to the gate electrode 18 to place the FET 15 in an ON state, electrons that serve as carriers are generated in the channel region. As a result, a state occurs in which the source electrode 16 is electrically connected to the drain electrode 17 by the channel region in which electrons that serve as carriers have been generated. When, in this state, a voltage is applied between the source electrode 16 and the drain electrode 17, current flows between the source electrode 16 and the drain electrode 17.

It should be noted that, in the FET 15 of the second embodiment, the source electrode 16 and the drain electrode 17 are formed on the exposed surface 13A of the multilayer body 11 described above in the first embodiment. In the FET 15, which includes the multilayer body 11, the modulation characteristics are improved.

Figure 11:
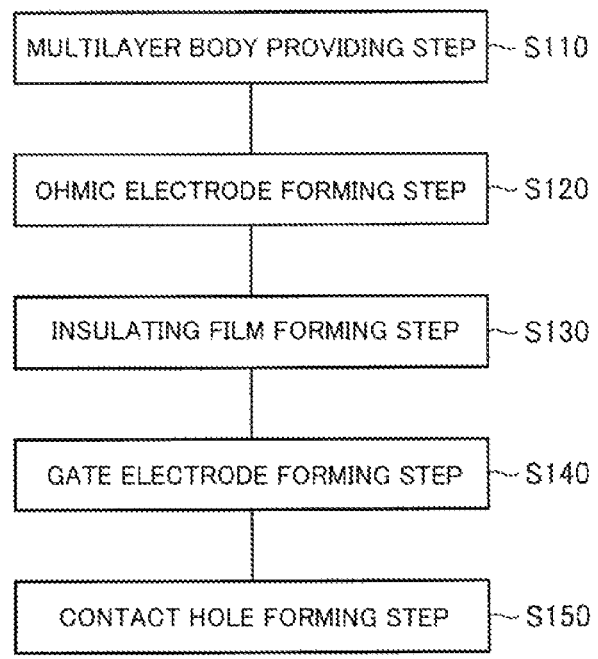
FIG. 11 is a flowchart illustrating representative steps of a method for manufacturing an FET including a graphene film.

Now, referring to FIG. 1 and FIG. 11, a method for manufacturing the FET 15 of the second embodiment will be described. FIG. 11 is a flowchart illustrating representative steps of the method for manufacturing the FET 15, which includes a graphene film. Referring to FIG. 11, in the method for manufacturing the FET 15 of the second embodiment, a step (S10), which is a multilayer body providing step, is first carried out. In this step (S110), the multilayer body 11 of the first embodiment is provided (see FIG. 1). The multilayer body 11 can be manufactured by using the manufacturing method described above in the first embodiment.

Figure 12:
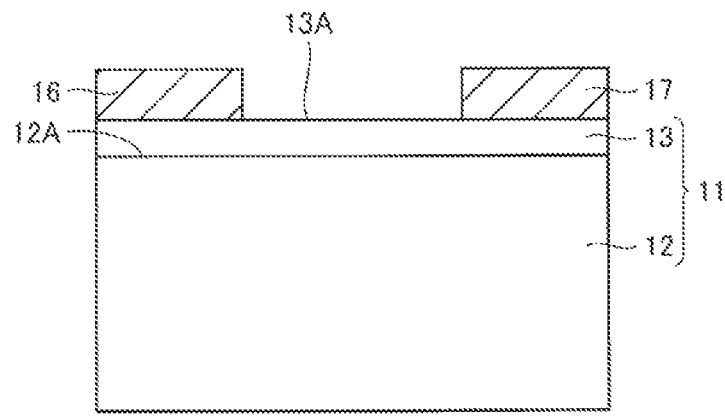
FIG. 12 is a schematic cross-sectional view for describing the method for manufacturing an FET including a graphene film.

Next, referring to FIG. 11, a step (S120), which is an ohmic electrode forming step, is carried out. Referring to FIG. 1 and FIG. 12, in this step (S120), the source electrode 16 and the drain electrode 17 are formed to be in contact with the exposed surface 13A of the multilayer body 11. The source electrode 16 and the drain electrode 17 can be formed in the following manner, for example. A mask layer is formed on the exposed surface 13A of the graphene film 13; the mask layer is made of a resist and has openings corresponding to the regions in which the source electrode 16 and the drain electrode 17 are to be formed. Thereafter, a conductive film made of a conductor (e.g., Ni/Au) that forms the source electrode 16 and the drain electrode 17 is formed. Subsequently, lift-off is carried out.

Figure 13:
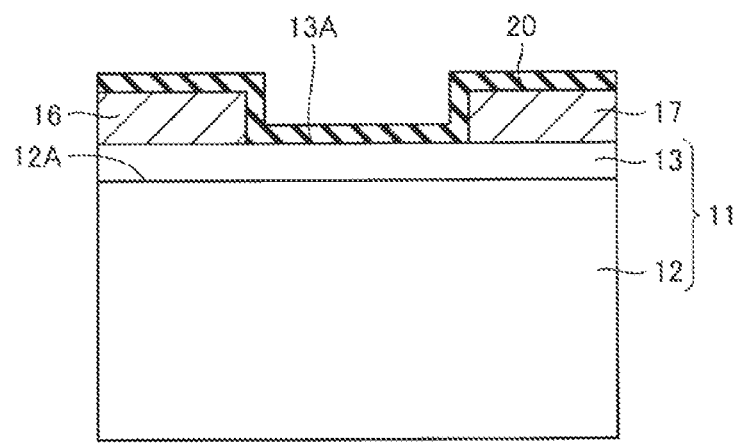
FIG. 13 is a schematic cross-sectional view for describing the method for manufacturing an FET including a graphene film.

Next, referring to FIG. 11, a step (S130), which is an insulating film forming step, is carried out. Referring to FIG. 12 and FIG. 13, in this step (S130), an insulating film 20 is formed to cover the portion of the exposed surface 13A of the graphene film 13 located between the source electrode 16 and the drain electrode 17, the major surface of the source electrode 16 on the side opposite to the multilayer body 11, and the major surface of the drain electrode 17 on the side opposite to the multilayer body 11. The insulating film 20 can be formed by using a CVD method, for example. A material that forms the insulating film 20 may be silicon nitride (SiN), for example.

Figure 14:
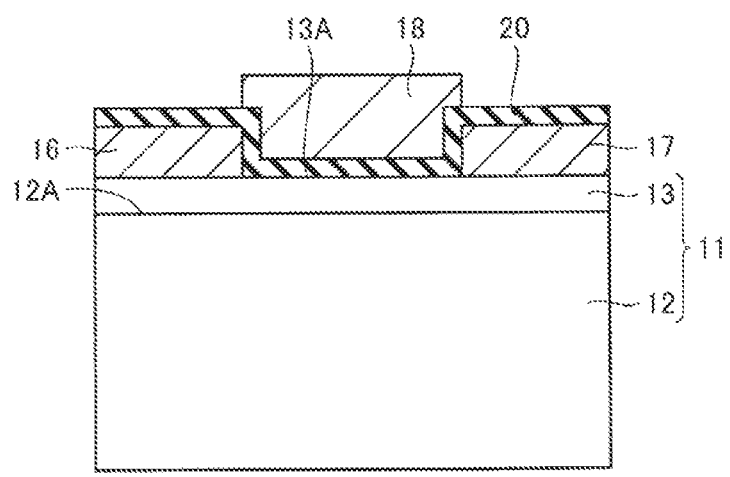
FIG. 14 is a schematic cross-sectional view for describing the method for manufacturing an FET including a graphene film.

Next, referring to FIG. 11, a step (S140), which is a gate electrode forming step, is carried out. Referring to FIG. 13 and FIG. 14, in this step (S140), the gate electrode 18 is formed on and in contact with the insulating film 20 that covers the portion of the exposed surface 13A located between the source electrode 16 and the drain electrode 17. The gate electrode 18 can be formed in the following manner, for example. A mask layer is formed which is made of a resist and has an opening corresponding to the region in which the gate electrode 18 is to be formed. Thereafter, a conductive film made of a conductor (e.g., Ni/Au) that forms the gate electrode 18 is formed. Subsequently, lift-off is carried out.

Next, referring to FIG. 11, a step (S150), which is a contact hole forming step, is carried out. Referring to FIG. 14 and FIG. 10, in this step (S150), the portions of the insulating film 20 located on the source electrode 16 and the drain electrode 17 are removed, and, accordingly, contact holes that enable contact of the source electrode 16 and the drain electrode 17 with interconnects are formed. Specifically, for example, a mask is formed which has openings in regions corresponding to a portion on the source electrode 16 and a portion on the drain electrode 17, and then, the portions of the insulating film 20 that are exposed in the openings are removed by etching. Accordingly, contact holes are formed, and the remaining portion of the insulating film 20 constitutes the gate insulating film 19. The gate insulating film 19 covers the portion of the exposed surface 13A located between the source electrode 16 and the drain electrode 17, and the gate insulating film 19 extends to regions that cover portions of upper surfaces (major surfaces on the side opposite to the side that is in contact with the graphene film 13) of the source electrode 16 and the drain electrode 17.

With the steps described above, the FET 15 of the second embodiment is completed. Subsequently, for example, interconnects are formed, and dicing is performed for singulation into individual electronic devices.

Note that in the embodiment described above, the multilayer body 11 is manufactured by removing silicon atoms from the first major surface of the SiC, however, this is merely exemplary. For example, a multilayer body 11 may be manufactured by bonding SiC and a graphene film together. Furthermore, silicon atoms may be removed from the silicon plane of the raw substrate 31 rather than the carbon plane thereof.

It is to be understood that the embodiments disclosed herein are illustrative in all respects and not restrictive in any way. The scope of the present disclosure is defined by the claims, not by the above description, and all changes which come within the meaning and range of equivalents of the claims are intended to be embraced therein.

REFERENCE SIGNS LIST

11 Multilayer body
12 Base portion
12A, 13B, 31A Major surface
12B Interface
13 Graphene film
13A Exposed surface
15 FET
16 Source electrode
17 Drain electrode
18 Gate electrode
19 Gate insulating film
20 Insulating film
21A, 21B, 21C, 21D, 21E, 23A, 23B, 23C, 23D, 23E, 26A, 26B, 26C, 26D, 26E, 28A, 28B, 28C, 28D, 28E Line 22A, 22B, 22C, 27A, 27B, 27C Region
31 Raw substrate
41 Heating apparatus
42 Body portion
42A Side wall portion
42B Bottom wall portion
42C Upper wall portion
43 Susceptor
43A Substrate holding surface
43C Closed space
44 Cover member
44A Upper wall surface
44B Side wall surface
45 Gas inlet tube
46 Gas outlet tube

The invention claimed is:

1. A multilayer body comprising:
a base portion including silicon carbide and having a first major surface; and
a graphene film disposed on the first major surface and having an exposed surface, the exposed surface being a major surface located on a side opposite to a side on which the base portion is located, wherein
in an ion mass distribution versus depth of the multilayer body determined by time-of-flight secondary ion mass spectrometry that uses bismuth ions as primary ions and uses cesium ions as sputtering ions,
detection intensities of $C_6$ ions have a maximum value at a depth of greater than 0 nm and 2.5 nm or less from the exposed surface,
detection intensities of $C_3$ ions have a maximum value at a depth of greater than 0 nm and 3.0 nm or less from the exposed surface,
detection intensities of $SiC_4$ ions have a maximum value at a depth of 0.5 nm or greater and 5.0 nm or less from the exposed surface,
detection intensities of SiC ions have a maximum value at a depth of 0.5 nm or greater and 10.0 nm or less from the exposed surface,
detection intensities of $Si_2$ ions have a maximum value at a depth of 0.5 nm or greater and 10.0 nm or less from the exposed surface, and
a value obtained by dividing the maximum value of the detection intensities of $SiC_4$ ions by an average of detection intensities of $SiC_4$ ions associated with a region of the multilayer body is 1 or greater and 3.5 or less, the region having distances from the exposed surface in a thickness direction of the multilayer body of equal to or greater than 8 nm and 12 nm or less.

2. The multilayer body according to claim 1, wherein the detection intensities of $C_6$ ions have a maximum value at a depth of greater than 0 nm and 1.5 nm or less from the exposed surface.

3. The multilayer body according to claim 1, wherein the detection intensities of $C_3$ ions have a maximum value at a depth of greater than 0 nm and 2.0 nm or less from the exposed surface.

4. The multilayer body according to claim 1, wherein the detection intensities of $SiC_4$ ions have a maximum value at a depth of 0.5 nm or greater and 3.5 nm or less from the exposed surface.

5. The multilayer body according to claim 1, wherein the value obtained by dividing the maximum value of the detection intensities of $SiC_4$ ions by an average of detection intensities of $SiC_4$ ions associated with a region of the multilayer body is 1 or greater and 2.5 or less, the region having distances from the exposed surface in a thickness direction of the multilayer body of equal to or greater than 8 nm and 12 nm or less.

6. The multilayer body according to claim 1, wherein
the detection intensities of SiC ions have a maximum value at a depth of 0.5 nm or greater and 8.0 nm or less from the exposed surface, and
the detection intensities of $Si_2$ ions have a maximum value at a depth of 0.5 nm or greater and 8.0 nm or less from the exposed surface.

7. The multilayer body according to claim 1, wherein a number of atomic layers of the graphene film is 1 or greater and 5 or less.

8. The multilayer body according to claim 1, wherein the first major surface is a carbon plane of the silicon carbide.

9. An electronic device comprising:
the multilayer body according to claim 1;
a first electrode disposed on the exposed surface; and
a second electrode disposed on the exposed surface and spaced apart from the first electrode.

10. The multilayer body according to claim 2, wherein the detection intensities of $C_3$ ions have a maximum value at a depth of greater than 0 nm and 2.0 nm or less from the exposed surface.

11. The multilayer body according to claim 2, wherein the detection intensities of $SiC_4$ ions have a maximum value at a depth of 0.5 nm or greater and 3.5 nm or less from the exposed surface.

12. The multilayer body according to claim 3, wherein the detection intensities of $SiC_4$ ions have a maximum value at a depth of 0.5 nm or greater and 3.5 nm or less from the exposed surface.

13. The multilayer body according to claim 2, wherein the value obtained by dividing the maximum value of the detection intensities of $SiC_4$ ions by an average of detection intensities of $SiC_4$ ions associated with a region of the multilayer body is 1 or greater and 2.5 or less, the region having distances from the exposed surface in a thickness direction of the multilayer body of equal to or greater than 8 nm and 12 nm or less.

14. The multilayer body according to claim 3, wherein the value obtained by dividing the maximum value of the detection intensities of $SiC_4$ ions by an average of detection intensities of $SiC_4$ ions associated with a region of the multilayer body is 1 or greater and 2.5 or less, the region having distances from the exposed surface in a thickness direction of the multilayer body of equal to or greater than 8 nm and 12 nm or less.

15. The multilayer body according to claim 4, wherein the value obtained by dividing the maximum value of the detection intensities of $SiC_4$ ions by an average of detection intensities of $SiC_4$ ions associated with a region of the multilayer body is 1 or greater and 2.5 or less, the region having distances from the exposed surface in a thickness direction of the multilayer body of equal to or greater than 8 nm and 12 nm or less.

16. The multilayer body according to claim 2, wherein a number of atomic layers of the graphene film is 1 or greater and 5 or less.

17. The multilayer body according to claim 3, wherein a number of atomic layers of the graphene film is 1 or greater and 5 or less.

18. The multilayer body according to claim 2, wherein the first major surface is a carbon plane of the silicon carbide.

19. The multilayer body according to claim 3, wherein the first major surface is a carbon plane of the silicon carbide.

20. The multilayer body according to claim 4, wherein the first major surface is a carbon plane of the silicon carbide.

* * * * *